United States Patent
Varghese et al.

(10) Patent No.: US 12,057,522 B2
(45) Date of Patent: Aug. 6, 2024

(54) COMPONENT WITH REDUCED ABSORPTION AND METHOD FOR PRODUCING A COMPONENT

(71) Applicant: OSRAM OPTO SEMICONDUCTORS GMBH, Regensburg (DE)

(72) Inventors: Tansen Varghese, Regensburg (DE); Petrus Sundgren, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 387 days.

(21) Appl. No.: 17/632,892

(22) PCT Filed: Jul. 23, 2020

(86) PCT No.: PCT/EP2020/070786
§ 371 (c)(1),
(2) Date: Feb. 4, 2022

(87) PCT Pub. No.: WO2021/028185
PCT Pub. Date: Feb. 18, 2021

(65) Prior Publication Data
US 2022/0320399 A1      Oct. 6, 2022

(30) Foreign Application Priority Data
Aug. 9, 2019  (DE) ............... 10 2019 121 580.3

(51) Int. Cl.
H01L 33/08    (2010.01)
H01L 33/00    (2010.01)
H01L 33/62    (2010.01)

(52) U.S. Cl.
CPC .......... *H01L 33/08* (2013.01); *H01L 33/005* (2013.01); *H01L 33/62* (2013.01); *H01L 2933/0066* (2013.01)

(58) Field of Classification Search
CPC ..... H01L 27/15; H01L 27/153; H01L 27/156; H01L 33/005; H01L 33/02; H01L 33/08;
(Continued)

(56) References Cited

U.S. PATENT DOCUMENTS

2005/0040409 A1    2/2005  Takeya et al.
2007/0087220 A1    4/2007  Alvarado et al.
(Continued)

FOREIGN PATENT DOCUMENTS

CN    1921172 A    2/2007
CN    101465377 A  6/2009
(Continued)

OTHER PUBLICATIONS

International Search Report (with English Translation) and Written Opinion in corresponding International Application No. PCT/EP2020/070786 mailed on Oct. 20, 2020, 12 pages.
(Continued)

*Primary Examiner* — Cheung Lee
(74) *Attorney, Agent, or Firm* — MH2 TECHNOLOGY LAW GROUP LLP

(57)  ABSTRACT

Disclosed is method for making a component and a component comprising a substrate, a semiconductor element arranged on the substrate, an intermediate layer arranged at least in sections between the substrate and the semiconductor element, and a first contact structure, wherein the semiconductor element has a first semiconductor layer, a second semiconductor layer and an active zone, which is arranged in a vertical direction between the semiconductor layers and designed for generating electromagnetic radiation. The active zone has locally deactivated regions along lateral directions, which are not designed for generating electromagnetic radiation. The semiconductor element has an opening which extends through the second semiconductor
(Continued)

layer and the active zone to the first semiconductor layer, wherein the opening is different from the deactivated regions of the active zone and is partially filled with a material of the intermediate layer.

20 Claims, 10 Drawing Sheets

(58) Field of Classification Search
CPC ......... H01L 33/14; H01L 33/20; H01L 33/22; H01L 33/24; H01L 33/38; H01L 33/382; H01L 33/385; H01L 33/505; H01L 33/54; H01L 33/62; H01L 2933/0066
See application file for complete search history.

(56) References Cited

U.S. PATENT DOCUMENTS

| | | |
|---|---|---|
| 2009/0152648 A1 | 6/2009 | Cho |
| 2013/0187192 A1 | 7/2013 | Hoeppel |
| 2014/0197372 A1 | 7/2014 | Jeong |
| 2015/0236146 A1 | 8/2015 | Liu et al. |
| 2015/0236209 A1 | 8/2015 | Pfeuffer |
| 2016/0093769 A1 | 3/2016 | vom Dorp et al. |
| 2016/0197232 A1 | 7/2016 | Bour et al. |
| 2018/0323343 A1 | 11/2018 | Jang et al. |
| 2019/0181298 A1 | 6/2019 | Park et al. |
| 2020/0220032 A1 | 7/2020 | Kopp et al. |

FOREIGN PATENT DOCUMENTS

| | | |
|---|---|---|
| CN | 102959741 A | 3/2013 |
| CN | 104662679 A | 5/2015 |
| CN | 105283967 A | 1/2016 |
| CN | 110010734 A | 7/2019 |
| DE | 102010025320 A1 | 12/2011 |
| DE | 102013110853 A1 | 4/2015 |
| EP | 2341543 A1 | 7/2011 |
| EP | 3131129 A1 | 2/2017 |
| JP | 2003289176 A | 10/2003 |
| JP | 2007201300 A | 8/2007 |
| WO | 2019025206 A1 | 2/2019 |

OTHER PUBLICATIONS

Chinese Office Action issued in Chinese Patent Application No. 202080056469.0 dated Jan. 2, 2024, with English language translation, 17 pages.

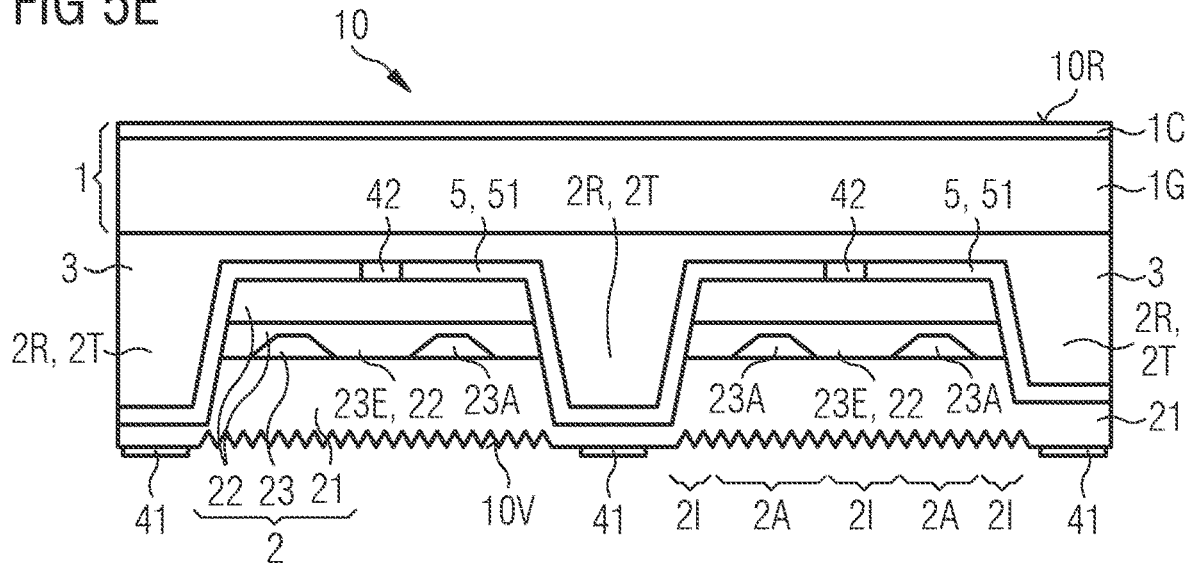
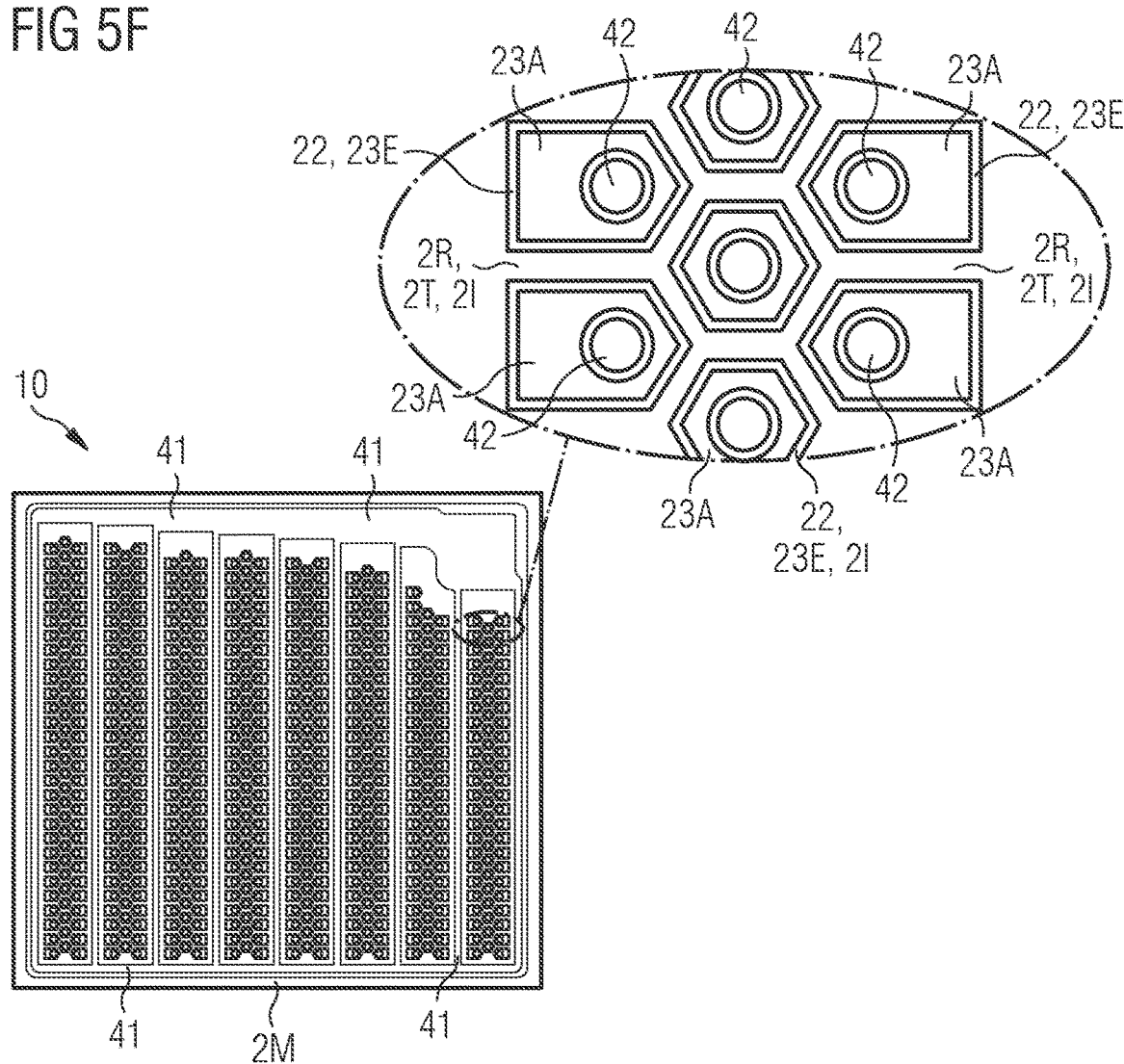

COMPONENT WITH REDUCED ABSORPTION AND METHOD FOR PRODUCING A COMPONENT

CROSS-REFERENCE TO RELATED APPLICATIONS

This patent application is a national stage entry from International Application No. PCT/EP2020/070786, filed on Jul. 23, 2020, published as International Publication No. WO 2021/028185 A1 on Feb. 18, 2021, and claims priority under 35 U.S.C. § 119 from German patent application 10 2019 121 580.3, filed Aug. 9, 2019, the entire contents of all of which are incorporated by reference herein.

FIELD

A component with reduced absorption and thus with improved efficiency is specified. Furthermore, a method for producing a component is specified.

BACKGROUND

The efficiency of a light-emitting component is greatly dependent on possible absorption losses. The absorption losses occur for example within a light-emitting semiconductor body or at metal contacts of the component.

In order to reduce the absorption losses at the electrical contacts, the contacts can be coated with radiation-reflecting material such as silver or can be formed from transparent electrically conductive materials. Moreover, the contacts composed of silver or transparent electrically conductive materials sometimes do not have the required electrical conductivity.

In order to reduce the absorption losses within the semiconductor body, the semiconductor body can be embodied with regard to its layer thickness and/or material selection in such a way that the absorption losses are minimized. However, the efficiency of the component with regard to generating light can be adversely influenced as a result of the reduction of the layer thickness or the specific material selection of the semiconductor body.

One object is to specify a component, in particular an optoelectronic component, with increased efficiency. A further object is to specify a reliable and cost-effective method for producing a component, in particular a component described here.

These objects are achieved by means of the component as claimed in the independent claim and by means of the method for producing the component. The further claims relate to further configurations of the component or of the method for producing the component.

SUMMARY

In accordance with at least one embodiment of the component, the latter has a carrier and a semiconductor body arranged on the carrier. The semiconductor body has a first semiconductor layer, a second semiconductor layer and an active zone, wherein the active zone is arranged in a vertical direction between the first semiconductor layer and the second semiconductor layer. In particular, the active zone is configured for generating electromagnetic radiation for instance in the infrared, visible or in the ultraviolet spectral range. The first semiconductor layer and the second semiconductor layer can be embodied as n-conducting and p-conducting, respectively, or vice versa. The first semiconductor layer and the second semiconductor layer can be embodied in each case as a single layer or as a layer sequence and/or can have a plurality of partial layers arranged one above another. The semiconductor body has a diode structure, in particular. The component is a semiconductor chip, in particular. The carrier is in particular the chip carrier, in particular the sole chip carrier of the component.

The semiconductor body can be formed from a III/V compound semiconductor material. A III/V compound semiconductor material comprises an element from the third main group, such as, for instance, B, Al, Ga, In, and an element from the fifth main group, such as, for instance, N, P, As. In particular, the term "III/V compound semiconductor material" encompasses the group of binary, ternary or quaternary compounds containing at least one element from the third main group and at least one element from the fifth main group, for example nitride and phosphide compound semiconductors. Such a binary, ternary or quaternary compound can additionally comprise for example one or more dopants and additional constituents. For example, the semiconductor body is based on GaN, InGaN, AlGaN, InGaAlN, InGaP, InGaAlP, InGaAlAs or on AlGaAs. Moreover, the semiconductor body can be formed from a II/VI compound semiconductor material.

In accordance with at least one embodiment of the component, the latter has an intermediate layer arranged at least regionally between the carrier and the semiconductor body. The intermediate layer is embodied as electrically conductive, in particular. For example, the intermediate layer is configured for electrically contacting the first or the second semiconductor layer. It is possible for the intermediate layer to have partial layers, which in particular are electrically insulated from one another, wherein one of the partial layers is provided for electrically contacting the first semiconductor layer and another of the partial layers is configured for electrically contacting the second semiconductor layer.

In accordance with at least one embodiment of the component, the latter has a first contact structure and a second contact structure. The first contact structure or the second contact structure can be embodied as a structured or continuous connection layer, which in particular directly or indirectly adjoins the first semiconductor layer or the second semiconductor layer. The connection layer can be formed from a material such as copper, aluminum or silver. It is possible for the first contact structure to be arranged on a surface of the semiconductor body facing away from the carrier. It is also conceivable for the first contact structure to be arranged between the carrier and the semiconductor body, wherein the first contact structure extends through the second semiconductor layer and the active zone for the purpose of electrically contacting the first semiconductor layer. By way of example, the second contact structure is arranged between the semiconductor body and the carrier. It is possible for the first contact structure or the second contact structure to be electrically connected to the intermediate layer or to a partial layer of the intermediate layer.

In accordance with at least one embodiment of the component, the active zone is locally deactivated along lateral directions. The local deactivation can be effected by means of local implantation, local diffusion or by means of ablation and regrowth. In this case, it is possible for the local implantation, diffusion and/or the ablation to be effected through the second semiconductor layer and the active zone to the first semiconductor layer or into the first semiconductor layer. The active zone has deactivated regions, in particular, which are not configured for generating electromagnetic radiation. The deactivated regions of the active zone in particular directly adjoin the active regions of the active zone, which are configured for generating electromagnetic radiation during operation of the component. In particular on account of different material compositions or on account of impurity substances, impurity atoms or impurity ions in the deactivated regions of the active zone, the active regions of the active zone have a smaller band gap in comparison with their surroundings. This has the effect that non-radiative recombinations of charge carriers are fostered to a lesser extent in the surroundings of the active zone, in particular at the edge of the active zone.

A lateral direction is understood to mean a direction that runs in particular parallel to a main area of extent of the carrier or of the semiconductor body. A vertical direction is understood to mean a direction that is directed in particular perpendicular to the main area of extent of the carrier or of the semiconductor body. The vertical direction and the lateral direction are in particular orthogonal to one another.

In accordance with at least one embodiment of the component, the locally deactivated regions are the regions of the active zone which are implanted or indiffused with impurity atoms or with impurity ions. Alternatively, the locally deactivated regions could be the ablated and regrown regions of the active zone.

The locally deactivated regions can furthermore be embodied as electrically conductive. In particular, the deactivated regions and the first semiconductor layer have freely mobile charge carriers of different charge carrier types. For example, the deactivated regions are embodied as n-conducting and the first semiconductor layer is embodied as p-conducting, or vice versa. In contrast to the active regions of the active zone, the locally deactivated regions are preferably not configured for generating electromagnetic radiation during operation of the component.

The deactivation on account of the diffusion or implantation, which in particular succeeds a thermal treatment, increases the band gap of the deactivated regions. The active regions of the active zone, which in particular are surrounded by the deactivated regions, thus have a smaller band gap than the surrounding deactivated regions. The increase in the band gap is attributable in particular to the intermixing of the material of the quantum barriers and quantum well layers (referred to as: quantum well intermixing).

During the ablation and regrowth, it is possible to ablate a material with a lower band gap. The ablated regions can be regrown with a material having a higher band gap, such that the deactivated and regrown regions have a higher band gap than their surroundings.

The locally deactivated regions thus have a higher band gap than the active regions of the active zone. The implantation, diffusion or the ablation and regrowth of the active zone, for instance around the active regions, can lead to a local displacement of the pn junction zone within the original active zone. The new position of the effective pn junction zone is situated in particular somewhat below the original pn junction zone.

In particular, the deactivated regions have a higher doping concentration than the activated regions of the active zone. The higher doping concentration can lead to a band bending, for instance at the edges of the active regions. The band bending can prevent charge carriers, for instance in the form of electrons or holes, which are injected into the active regions from passing to the edges of the active regions and recombining non-radiatively there.

In accordance with at least one embodiment of the component, the semiconductor body has an opening. The opening extends in particular through the second semiconductor layer and the active zone toward the first semiconductor layer. It is possible for the opening to extend only as far as the first semiconductor layer or into the first semiconductor layer. In plan view, the opening can have the form of a multiply branched mask that can divide the active zone into a plurality of active regions spaced apart laterally. For example, the opening has the form of a network of interconnected separating trenches. In plan view, the opening or the openings is/are situated for example in the deactivated regions, in particular exclusively in the deactivated regions. The deactivated regions can subdivide the active zone into a plurality of singulated, spatially isolated and active regions.

The semiconductor body can be subdivided into a plurality of partial regions, wherein each of the partial regions can have at least one active region or a plurality of active regions of the active zone and at least one locally deactivated region of the active zone. In this sense, these partial regions form the active regions of the semiconductor body. It is also possible for each of the partial regions to have a plurality of locally deactivated regions of the active zone. In particular, the partial regions of the semiconductor body are drivable individually, that is to say independently of one another.

The opening can be partly filled with a material of the intermediate layer. It is possible for a large portion of the opening, for example between 50% and 90% inclusive, for instance between 60% and 80% inclusive, to be filled with a material or with the materials of the intermediate layer. The opening can have sidewalls that are passivated with an electrically insulating material. The sidewalls of the opening themselves can be formed regionally by surfaces of the deactivated regions of the active zone or of the semiconductor body. The opening is in particular free of the active zone. In other words, the opening and the active zone are free of overlaps in plan view.

In accordance with at least one embodiment of the component, the first contact structure overlaps the opening of the semiconductor body in plan view. In plan view, the first contact structure is thus situated at the locations at which the active zone, in particular the active regions of the active zone, is/are not present. A direct shading by the first contact structure or a direct radiation absorption by the first contact structure is thus avoided.

In at least one embodiment of the component, the latter has a carrier, a semiconductor body arranged on the carrier, an intermediate layer arranged at least regionally between the carrier and the semiconductor body, and a first contact structure. The semiconductor body contains a first semiconductor layer, a second semiconductor layer and an active zone, wherein the active zone is arranged in a vertical direction between the semiconductor layers and is configured for generating electromagnetic radiation. The active zone has locally deactivated regions along the lateral directions, which are not configured for generating electromagnetic radiation. Moreover, the semiconductor body has an opening extending through the second semiconductor layer and the active zone toward the first semiconductor layer. In this case, the opening can extend as far as the first semiconductor layer or into the first semiconductor layer. The opening is moreover different than the deactivated regions of the active zone. In particular, the opening is partly filled with a material of the intermediate layer. The first contact structure is configured for electrically contacting the first semiconductor layer and overlaps the opening in plan view.

The opening or the openings is/are situated in particular exclusively in the deactivated regions. The opening is in particular free of the active regions of the active zone, in which electromagnetic radiation is generated. Since the first contact structure overlaps the opening in plan view, moreover, the first contact structure, in plan view, is situated in particular in the regions in which no electromagnetic radiation is emitted, such that radiation losses as a result of direct absorption at the first contact structure are minimized.

Since the active zone is subdivided into radiation-active regions and radiation-inactive regions, wherein the radiation-inactive regions can be effected by targeted deactivation or ablation of the material of the active zone, the component can be embodied on the basis of the structured active zone in such a way that said component has a predefined targeted luminous pattern, whereby the efficiency of the component overall is increased. The component has a second contact structure configured in particular for electrically contacting the second semiconductor layer. In plan view, the second contact structure can overlap the radiation-inactive regions, that is to say the deactivated regions, of the active zone.

In accordance with at least one embodiment of the component, the active zone is subdivided into a plurality of singulated active regions, wherein each singulated active region is assigned an inner deactivated region and the inner deactivated region is partly or fully circumferentially laterally enclosed by the associated singulated active region. The component can have at least one of the following additional features, according to which:
  i. the locally deactivated regions are furthermore embodied as electrically conductive and have a higher band gap than active regions of the active zone; or
  ii. the opening has a network of interconnected separating trenches, such that the opening is embodied regionally in trench-type fashion and in continuous fashion, and the singulated active regions are in each case enclosed in lateral directions by the deactivated regions.

It is possible for the component to have both additional feature i and additional feature ii.

In accordance with at least one embodiment of the component, the active zone has active regions configured for generating electromagnetic radiation, wherein the first contact structure and/or the second contact structure are/is free of an overlap with the active regions of the active zone in plan view. A direct covering of the active regions of the active zone and thus an absorption of the emitted radiation by the first and/or second contact structure can be avoided.

In accordance with at least one embodiment of the component, the opening has a network of interconnected separating trenches, such that the opening is embodied regionally in trench-type fashion and in continuous fashion. The active zone can be subdivided into a plurality of singulated active regions, which are enclosed, in particular fully circumferentially enclosed, in each case in lateral directions by the deactivated regions. The singulated active regions can thus be partly or fully circumferentially enclosed in each case in lateral directions by the deactivated regions. The separating trenches are covered in particular regionally with the deactivated regions.

In accordance with at least one embodiment of the component, each singulated active region is assigned an inner deactivated region of the active zone. The inner deactivated region can be laterally enclosed, in particular fully circumferentially enclosed, by the associated singulated active region. The inner deactivated region can thus be partly or fully circumferentially laterally enclosed by the associated singulated active region. Each of the active regions of the semiconductor body can have an active region of the active zone and at least one or exactly two or a plurality of deactivated regions of the active zone.

In accordance with at least one embodiment of the component, the latter has a second contact structure for electrically contacting the second semiconductor layer, wherein the second contact structure is arranged in a vertical direction between the carrier and the semiconductor body. In particular, in plan view, the second contact structure overlaps the inner deactivated region of the active zone or the inner deactivated regions of the active zone.

In accordance with at least one embodiment of the component, each singulated active region is assigned an outer deactivated region of the active zone, wherein the outer deactivated region laterally encloses the associated singulated active region.

Consequently, each of the singulated active regions of the semiconductor body can have an edge region that is not configured for generating electromagnetic radiation. The deactivated region can form a non-radiative edge region of the singulated active region and can in particular directly adjoin the opening of the semiconductor body or a separating trench of the opening.

The singulated active region is embodied in particular in continuous fashion. In this case, it is possible for the singulated active region to have an inner deactivated region of the active zone. In plan view, the first contact structure or the second contact structure can be arranged on or in the inner deactivated region of the active zone. In plan view, the inner deactivated region can overlap and in particular completely cover the second contact structure, in particular a partial layer of the contact structure.

In accordance with at least one embodiment of the component, the first contact structure is embodied in the form of a via contact, wherein the via contact is arranged within the opening. For the purpose of electrically contacting the first semiconductor layer, the via contact can extend through the second semiconductor layer and the active zone. The via contact can be embodied as part of the intermediate layer.

In accordance with at least one embodiment of the component, the first contact structure is arranged on a surface of the semiconductor body facing away from the carrier. In particular, the first contact structure directly adjoins the first semiconductor layer. The first contact structure can be embodied in continuous fashion. In particular, the first contact structure has openings in the form of windows, wherein, in plan view, the active regions of the semiconductor body or of the active zone are arranged in the windows of the contact structure and are thus in particular free of overlaps with the first contact structure.

In accordance with at least one embodiment of the component, the intermediate layer is a continuous and electrically conductive layer, wherein the intermediate layer is configured exclusively for electrically contacting the second semiconductor layer of the semiconductor body.

In accordance with at least one embodiment of the component, the intermediate layer has a first partial layer for electrically contacting the first semiconductor layer and a second partial layer for electrically contacting the second semiconductor layer, wherein the first partial layer and the second partial layer are laterally spaced apart. For example, the first partial layer and the second partial layer are electrically insulated from one another by an insulation structure. The first partial layer can be assigned to a first electrical polarity of the component. The second partial layer can be assigned to a second electrical polarity of the component. The intermediate layer can have a plurality of such first partial layers and/or a plurality of such second partial layers. In particular, the first partial layer and the second partial layer are free of overlap in plan view.

In accordance with at least one embodiment of the component, the intermediate layer has a first partial layer for electrically contacting the first semiconductor layer and a second partial layer for electrically contacting the second semiconductor layer, wherein the first partial layer and the second partial layer are arranged one above the other in a vertical direction and are electrically insulated from one another by an insulation structure or by insulation structures.

In accordance with at least one embodiment of the component, the active zone has locally deactivated regions and active regions along lateral directions, wherein the deactivated regions and the active regions are based on the same semiconductor material. For example, the deactivated regions have implanted or indiffused impurity atoms or impurity ions in comparison with the active regions, as a result of which the deactivated regions have a higher band gap than the active regions. The impurity atoms and impurity ions can be impurity substances or dopants. The local implantation or indiffusion of such substances into the active zone generally leads to quantum well intermixing and hence to the increase in the band gap.

In accordance with at least one embodiment of the component, the active zone has locally deactivated regions and active regions along the lateral directions, wherein the deactivated regions and the active regions differ from one another with regard to the material composition. In particular, the deactivated regions and the second semiconductor layer are based on the same semiconductor material. The deactivated regions are formed for example by local ablation of the active zone, wherein the ablated regions of the active zone are regrown. For example, the original active zone is ablated regionally, for instance by means of an etching method, in such a way that material of the active zone is completely removed in some regions, wherein these regions are subsequently filled with the material of the second semiconductor layer. The ablation and regrowth of the active zone leads to a local displacement of the pn junction zone within the original active zone. The new position of the effective pn junction zone is situated in particular somewhat below the original pn junction zone.

In one embodiment of an electronic device, the latter comprises the component described here. The electronic device can be a smartphone, touchpad, laser printer, detection camera, display or a system of LEDs, sensors, laser diodes and/or detectors. The component can additionally find application in a light source. For example, the component is provided for general lighting, for instance for interior or exterior lighting. The component can be embodied as a light source for a spotlight or headlight, for instance for a motor vehicle headlight. For example, the component is a high-power LED.

In at least one embodiment of the method for producing a component comprising a carrier, a semiconductor body arranged on the carrier, an intermediate layer arranged at least regionally between the carrier and the semiconductor body, and a first contact structure, a semiconductor body is provided. The semiconductor body has a first semiconductor layer, a second semiconductor layer and an active zone, which is arranged in a vertical direction between the semiconductor layers and is configured for generating electromagnetic radiation. The semiconductor body has an opening extending through the second semiconductor layer and the active zone toward the first semiconductor layer. The opening is partly filled with a material of the intermediate layer, wherein the first contact structure is configured for electrically contacting the first semiconductor layer and overlaps the opening in plan view. In particular, the active zone is deactivated regionally along lateral directions, such that the active zone has locally deactivated regions, which are not configured for generating electromagnetic radiation. In this case, the opening is different than the deactivated regions of the active zone.

In accordance with at least one embodiment of the method, the active zone is subdivided into a plurality of singulated active regions, wherein each singulated active region is assigned an inner deactivated region and the inner deactivated region is partly or fully circumferentially laterally enclosed by the associated singulated active region. The component to be produced can have at least one of the following additional features, according to which:
  i. the locally deactivated regions are furthermore embodied as electrically conductive and have a higher band gap than active regions of the active zone; or
  ii. the opening has a network of interconnected separating trenches, such that the opening is embodied regionally in trench-type fashion and in continuous fashion, and the singulated active regions are in each case enclosed in lateral directions by the deactivated regions.

It is also possible for the component to be produced to have both additional feature i and additional feature ii.

In accordance with at least one embodiment of the method, for the purpose of producing the deactivated regions, the active zone is deactivated regionally along lateral directions by means of ion implantation. Alternatively or additionally, it is possible for the active zone to be deactivated regionally along lateral directions by means of diffusion of impurity atoms or impurity ions.

In accordance with at least one embodiment of the method, for the purpose of producing the deactivated regions, the active zone is locally ablated, for example by means of an etching method, wherein the locally ablated regions are subsequently regrown with a material of the second semiconductor layer. It is possible that, after the ablation and regrowth, the semiconductor body, in particular the active zone, is further deactivated regionally by means of implantation or diffusion. In other words, the deactivated regions can be produced by ablation and regrowth and/or by implantation or diffusion.

The method described here is particularly suitable for the production of a component described here. Therefore, the features described in association with the component can also be used for the method, and vice versa.

BRIEF DESCRIPTION OF THE DRAWINGS

Further embodiments and developments of the component or of the method for producing the component are evident from the exemplary embodiments explained below in conjunction with FIGS. 1 to 7B, in which:

FIGS. 5A, 5B, 5C, 5D, 5E and 5F show schematic illustrations of various steps of a further method for producing a component in each case in plan view or in sectional view.

DETAILED DESCRIPTION

Elements that are identical, of identical type or act identically are provided with identical reference signs in the figures. The figures are in each case schematic illustrations and therefore not necessarily true to scale. Rather, comparatively small elements and in particular layer thicknesses may be illustrated with exaggerated size for elucidation purposes.

Figure 1:
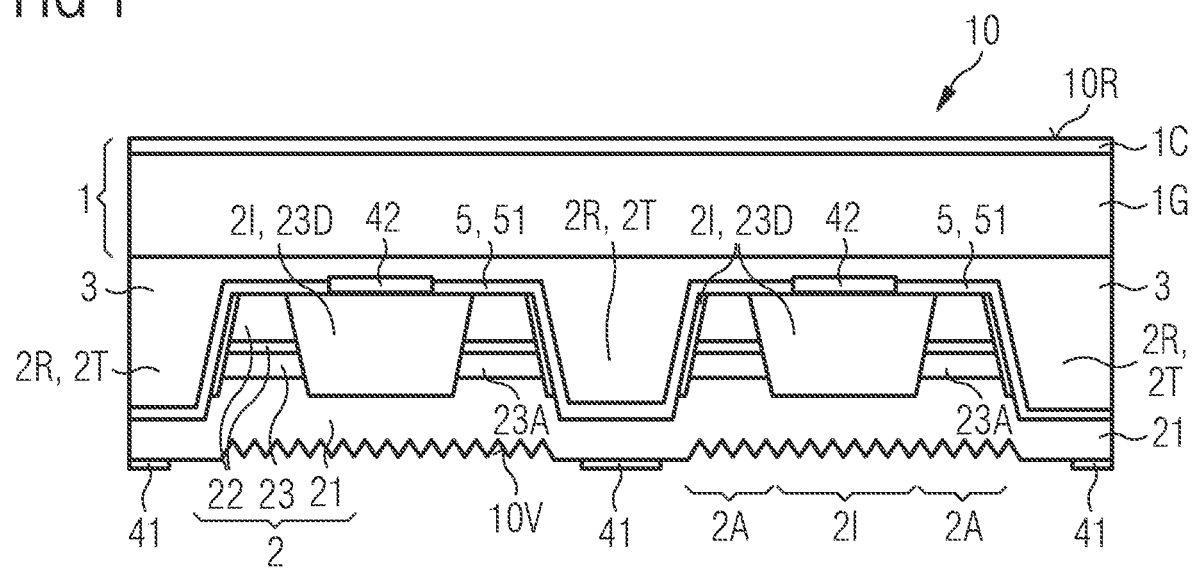
FIGS. 1 and 2 show schematic illustrations of different exemplary embodiments of a component in sectional views.

FIG. 1 shows a component 10 comprising a carrier 1 and a semiconductor body 2 arranged on the carrier 1. An intermediate layer 3 is arranged between the carrier 1 and the semiconductor body 2. The component 10 has a front side 10V, which in particular is embodied as a radiation exit side of the component 10. The front side 10V is embodied in structured fashion and has a plurality of output coupling structures. For example, the front side 10V is formed by a surface of the semiconductor body 2. The component 10 has a rear side 10R facing away from the front side 10V. The rear side 10R is formed by a surface of the carrier 1, in particular by a surface of a cover layer 1C of the carrier 1. The cover layer 1C can be formed from an electrically conductive material. The rear side 10R forms in particular a mounting surface of the component 1. The carrier 1 is in particular different than a growth substrate. For example, the carrier 1 has a main body 1G, wherein the main body 1G can be formed from an electrically conductive material, for instance from a metal, or from an electrically insulating material, for instance from a ceramic or a plastic. If the main body 1G is formed from an electrically insulating material, the carrier 1 can have through contacts 13 connecting the cover layer 1C to the intermediate layer 3 in an electrically conductive manner. The through contacts 13 thus extend along the vertical direction through the main body 1G. Such through contacts 13 are illustrated schematically in FIG. 6B, for example.

The semiconductor body 2 has a first, in particular n-conducting, semiconductor layer 21, a second, in particular p-conducting, semiconductor layer 22 and an active zone 23 arranged between the first semiconductor layer 21 and the second semiconductor layer 22. It is also possible for the first semiconductor layer to be embodied as p-conducting and for the second semiconductor layer 22 to be embodied as n-conducting. Both the first semiconductor layer 21 and the second semiconductor layer 22 can be embodied as a single layer or as a layer sequence. FIG. 1 schematically illustrates that the second semiconductor layer 22 can have two or a plurality of partial layers. The first semiconductor layer 21 faces away from the carrier 1. The second semiconductor layer 22 faces the carrier 1.

An active zone 23 of the component 10 should be understood to mean an active area in the semiconductor body 2 in which electromagnetic radiation is generated during the operation of the component 10. In particular, this active area is situated in a manner dispersed between the first semiconductor layer 21 and the second semiconductor layer 22 and is thus in particular not embodied in continuous fashion. The active zone 23 is embodied in structured fashion in this sense and can have a plurality of active regions 23A spaced away laterally. Such active regions 23A can be individually electrically contacted and driven in groups or individually. For example, the active zone 23 comprises one pn junction zone or a collection of pn junction zones in the semiconductor body 2.

In accordance with FIG. 1, the semiconductor body 2 has an opening 2R. Along the vertical direction, the opening 2R extends through the second semiconductor layer 22 and the active zone 23 toward the first semiconductor layer 21. In FIG. 1, the opening 2R extends into the first semiconductor layer 21. Since the opening 2R does not extend through the first semiconductor layer 21, the first semiconductor layer 21 is still embodied in continuous fashion. For example, a continuous surface of the first semiconductor layer 21 forms the radiation exit side of the component 10.

The opening 2R can be embodied as a network, in particular as a continuous network, of a plurality of separating trenches 2T. Such a network of the separating trenches 2T is illustrated schematically in FIG. 3D, for example. The active zone 23 is divided in particular into a plurality of active regions 23A spaced apart laterally. The second semiconductor layer 22 can also be divided into a plurality of partial layers spaced apart laterally, wherein each of the partial layers of the second semiconductor layer 22 can be assigned to exactly one of the active regions 23A, and in particular vice versa. In lateral directions, the partial layers of the second semiconductor layer 22 and the active regions 23A of the active zone 23 can be enclosed, in particular fully circumferentially enclosed, in each case by the deactivated regions.

In accordance with FIG. 1, the opening 2R is partly filled by a material of the intermediate layer 3. The intermediate layer 3 can be embodied as a continuous electrically conductive layer configured in particular for electrically contacting the second semiconductor layer 22. For the purpose of electrically insulating the intermediate layer 3 from the sidewalls of the active regions 23A of the active zone 23 and from the first semiconductor layer 21, an insulation structure 5, for instance a first insulation structure 51, is arranged between the intermediate layer 3 and the semiconductor body 2. Consequently, the intermediate layer 3 is not in direct electrical contact with the sidewalls of the active regions 23A and with the first semiconductor layer 21. It is possible for the first insulation structure 51 to be embodied as radiation-reflecting. For example, the first insulation structure 51 can comprise radiation-reflecting particles embedded in a matrix material of the insulation structure 51. Alternatively, it is possible for the first insulation structure 51 to be formed from an electrically insulating and radiation-reflecting material.

In accordance with FIG. 1, the semiconductor body 2 has a plurality of inactive regions 2I spaced apart laterally. The inactive regions 2I, along the lateral directions, in particular directly adjoin the active regions 2A of the semiconductor body 2. Along the vertical direction, the inactive regions 2I extend through the second semiconductor layer 22 and the active zone 23 to the first semiconductor layer 21. The inactive regions 2I each have a locally deactivated region 23D of the active zone 23, which is not provided for generating electromagnetic radiation during operation of the component 10. Consequently, the inactive regions 2I each comprising a locally deactivated region 23D are not configured for generating electromagnetic radiation during operation of the component 10.

The semiconductor body 2 has in particular a plurality of singulated active regions 2A spaced apart laterally. For example, each active region 2A is assigned an inner inactive region 2I and an outer inactive region 2I of the semiconductor body 2. In part apart from the first semiconductor layer 21, the semiconductor body 2 in accordance with FIG.

1 is thus subdivided into a plurality of singulated active regions 2A and into a plurality of singulated inactive, in particular inner, regions 2I.

The outer inactive region 2I forms in particular the sidewalls of the respective active region 2A. In lateral directions, the inner inactive region 2I can be surrounded, in particular fully circumferentially enclosed, by the associated active region 23A or by the active regions 23A of the active zone 23. The singulated active region 23A of the active zone 23 can in turn be surrounded, in particular fully circumferentially enclosed, by the outer inactive region 2I or by the outer locally deactivated region 23D. This is illustrated schematically in plan view in FIG. 3D, for example. The semiconductor body 2 of the component 10 can have more than 1, 10, 30, 50, 70, 100 or more than 200, for instance between 1 and 1000 inclusive or between 1 and 300 inclusive, of such singulated active regions 2A. The active regions 2A form in particular a periodically repeating pattern in plan view. For example, the semiconductor body 2 has a plurality of columns and/or rows formed from such patterns.

For the purpose of electrically contacting the semiconductor body 2, the component 10 has a first contact structure 41 and a second contact structure 42. The second contact structure 42 is arranged between the semiconductor body 2 and the intermediate layer 3. In particular, the second contact structure 42 extends through the insulation structure 5. The second contact structure 42 and the intermediate layer 3 can be formed from different materials. It is possible for the second contact structure 42 to directly adjoin the intermediate layer 3 and/or an inner inactive region 2I or the inner inactive regions 2I. In a plan view of the carrier 1, the inner inactive regions 2I of the semiconductor body 2 can cover, in particular completely cover, the second contact structure 42. Since the inactive regions 2I are not configured for generating electromagnetic radiation, radiation losses on account of possible absorption at the second contact structure 42 can be avoided.

The outer inactive regions 2I are spatially separated in particular from the inner inactive regions 2I and from the second contact structure 42. The second contact structure 42 has a plurality of partial layers spaced apart laterally, each of which can be assigned to exactly one of the inner inactive regions 2I, and in particular vice versa. Each of the partial layers of the second contact structure 42 is configured in particular for electrically contacting the second semiconductor layer 22 of a singulated active region 2A of the semiconductor body 2.

In accordance with FIG. 1, all partial layers of the second contact structure 42 can be electrically conductively connected to the intermediate layer 3. Alternatively, it is possible for the intermediate layer to have a plurality of partial layers spaced apart laterally, wherein the partial layers of the intermediate layer 3 are electrically conductively connected in each case to exactly one partial layer or to a plurality of partial layers of the second contact structure 42. In this way, the active regions 2A of the semiconductor body 2 can be driven individually or in groups.

Figure 3A:
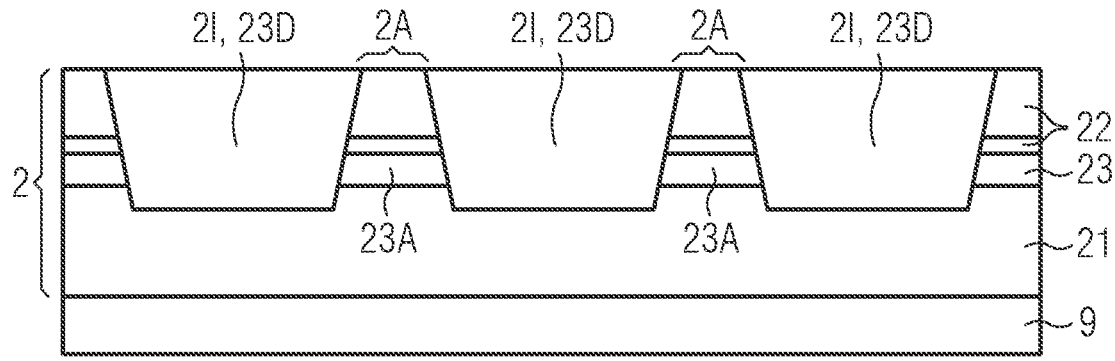
FIGS. 3A, 3B, 3C, 3D, 3E and 3F show schematic illustrations of various steps of a method for producing a component in each case in plan view or in sectional view.
Figure 3B:
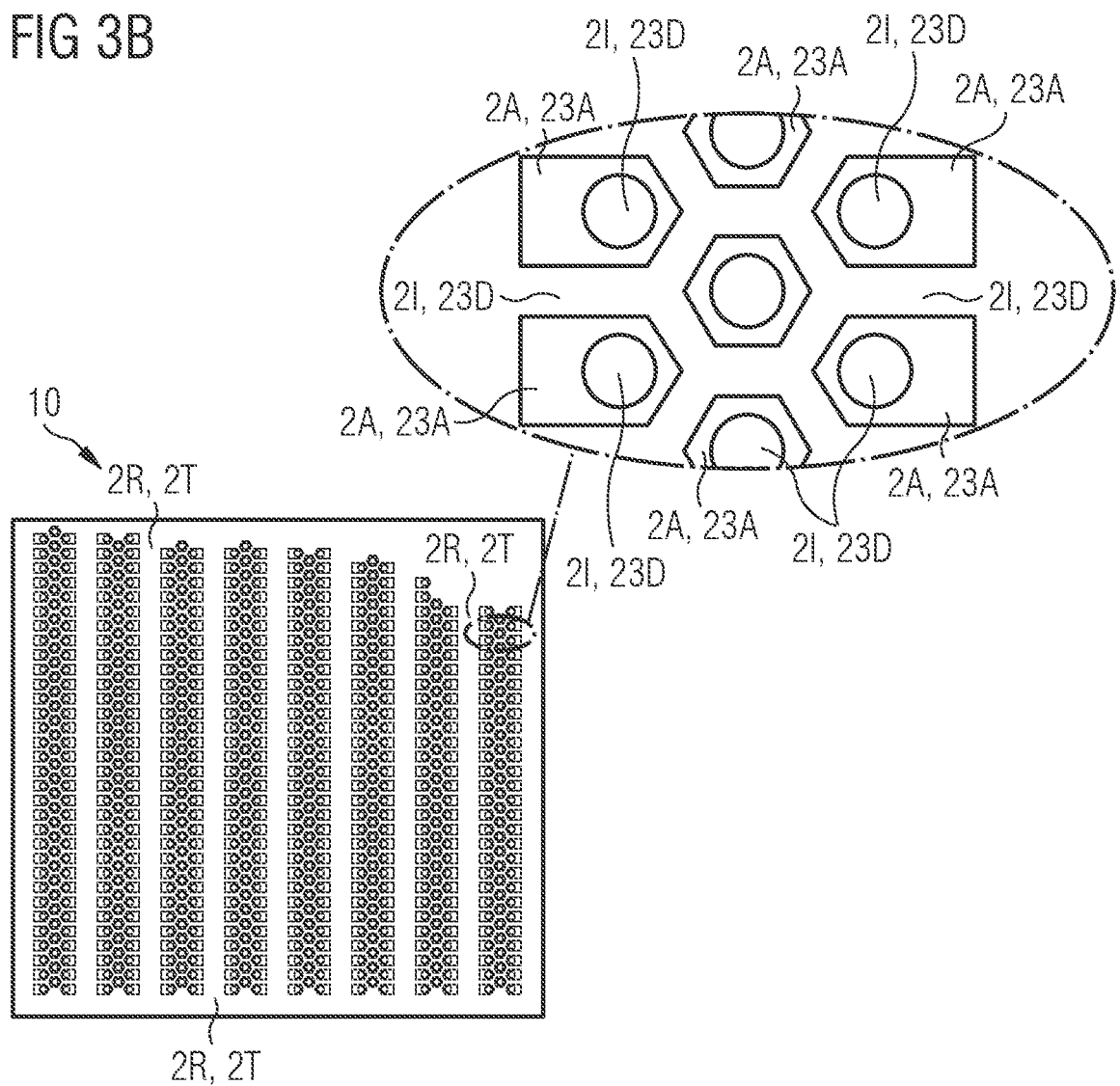
Figure 3C:
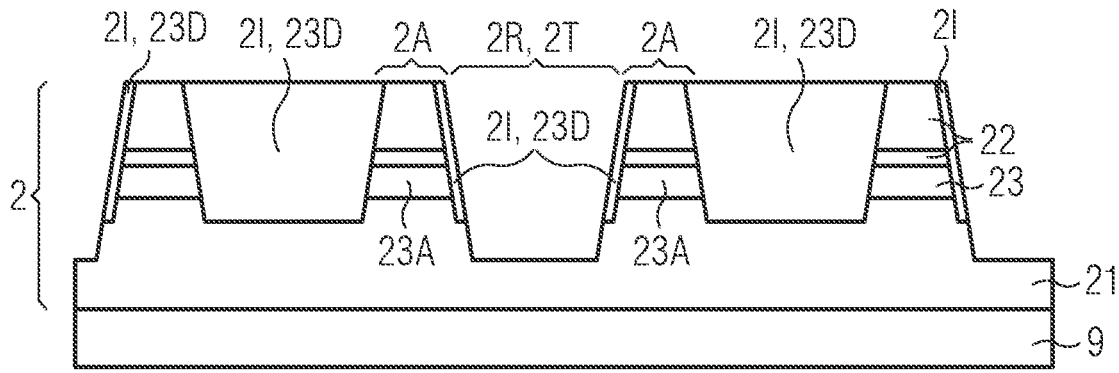
Figure 3D:
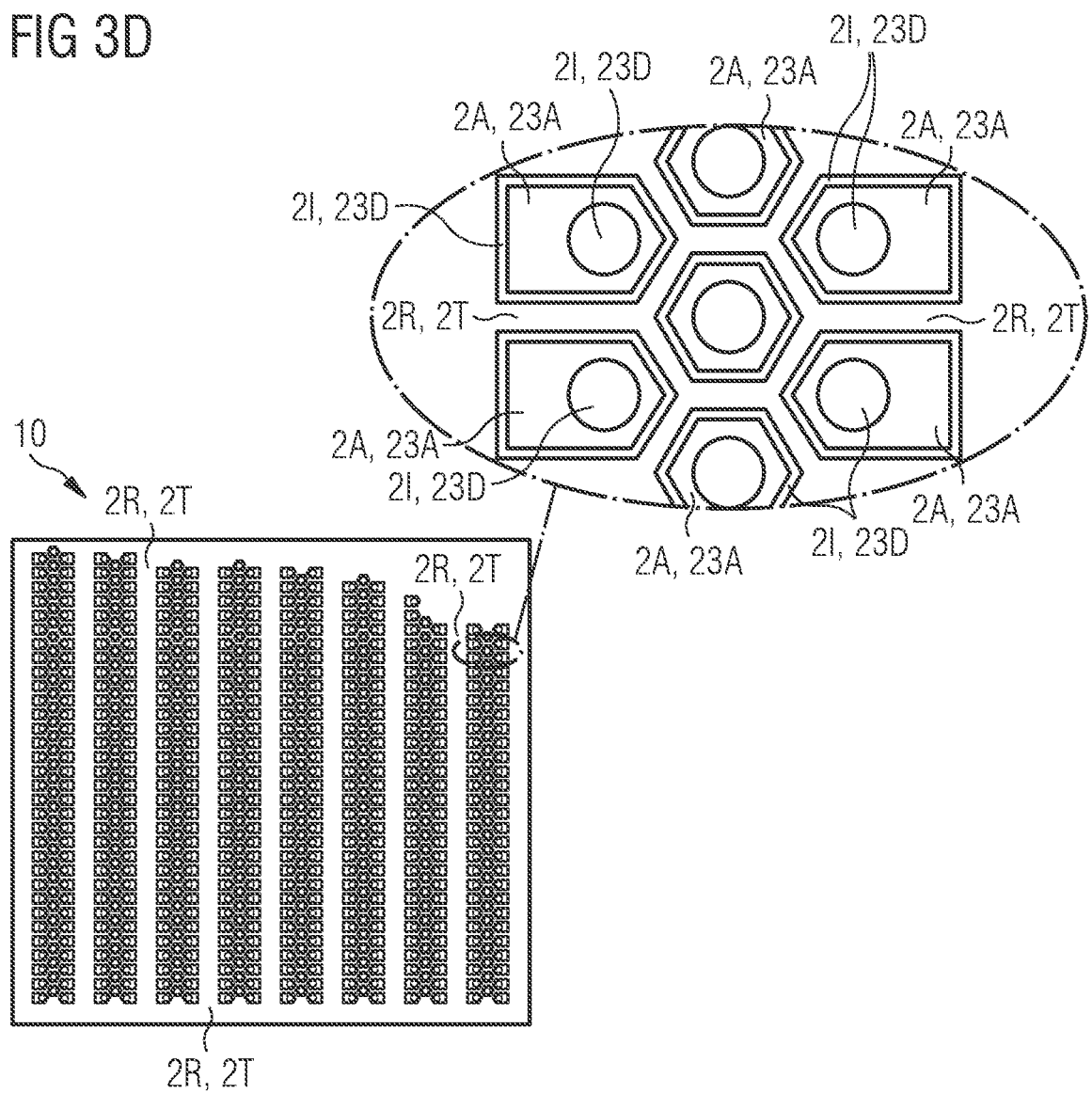
Figure 3E:
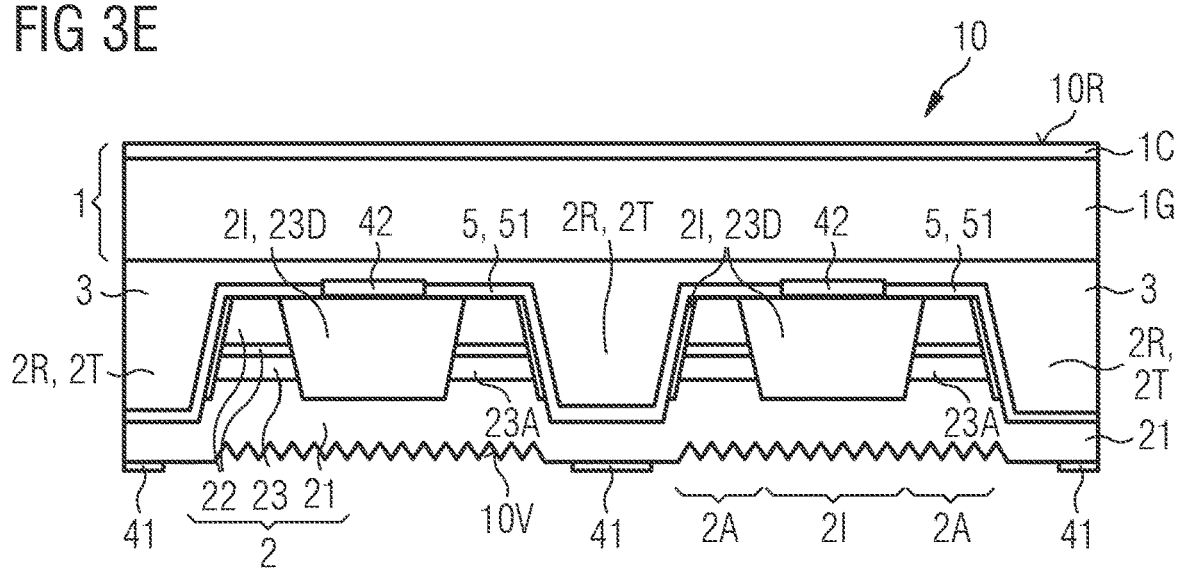
Figure 3F:
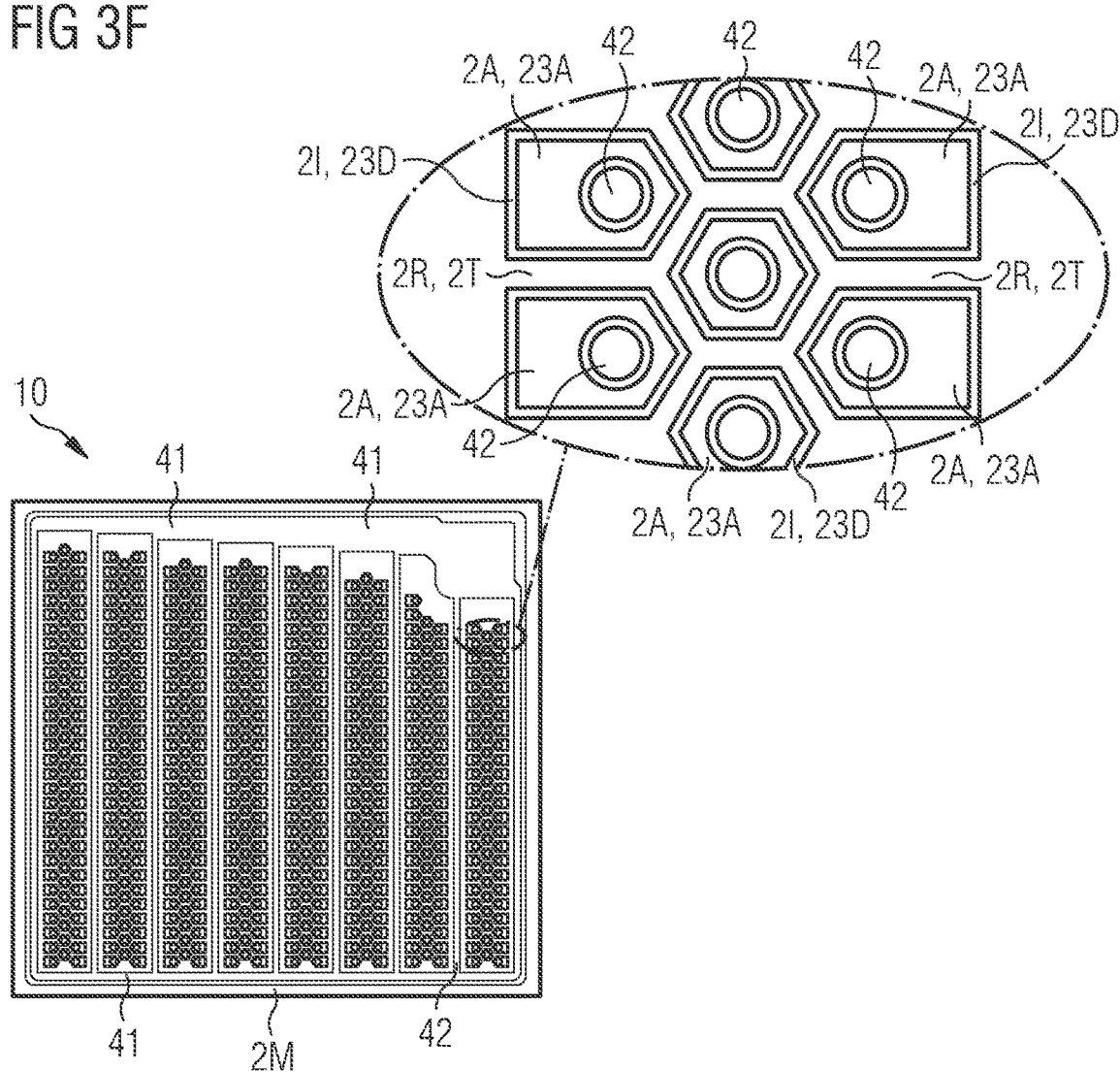

The second contact structure 42 is illustrated in plan view in FIG. 3F or 5F, for example. The second contact structure 42 has a plurality of partial layers spaced apart laterally, each of which is configured for electrically contacting one of the active regions 2A. In plan view, the partial layers of the second contact structure 42 are situated in each case in particular completely within one of the inner inactive regions 2I of the semiconductor body 2. To put it another way, each of the partial layers of the second contact structure 42 completely overlaps one of the inner active regions 2I and in particular does not project laterally beyond it.

In accordance with FIG. 1, the first contact structure 41 is arranged on the side of the front side 10V of the component 10. The first contact structure 41 is configured for electrically contacting the first semiconductor layer 21 and can directly adjoin the latter. In a plan view of the carrier 1, the first contact structure 41 has overlaps with the opening 2R or with the separating trenches 2T. In particular, the first contact structure 41 is free of an overlap with the active regions 2A of the semiconductor body 2. Consequently, the first contact structure 41 is for instance likewise free of an overlap with the active regions 23A of the active zone 23. In a plan view of the carrier 1, therefore, the first contact structure 41 does not cover any active regions 23A of the active zone 23, which are configured for generating electromagnetic radiation during operation of the component 10. A direct shading of the active regions 2A of the semiconductor body 2 by the first contact structure 41 is thus avoided, whereby radiation losses on account of possible absorption at the first contact structure 41 are minimized.

The first contact structure 41 is illustrated in plan view in FIG. 3F or 5F, for example. The first contact structure 41 can have a circumferential frame and inner distribution webs. The inner distribution webs are electrically conductively connected to the circumferential frame, in particular. In a plan view of the carrier 1, the first contact structure 41, in particular apart from its circumferential frame, is situated exclusively in the region of the opening 2R or in the region of the separating trenches 2T. In other words, the distribution webs of the first contact structure 41 completely overlap the opening 2R or the separating trenches 2T and are thus free of overlaps with the active regions 23A of the active zone 23.

The inactive regions 2I of the semiconductor body 2 as illustrated in FIG. 1 can be deactivated with regard to the generation of electromagnetic radiation by means of implantation or by means of indiffusion of dopants or impurity substances, for instance of impurity ions or impurity atoms. In particular, the active zone 23 can be locally deactivated in the inactive regions 2I in such a way that the locally deactivated regions 23D of the inactive regions 2I have a higher band gap than the active regions 23A of the active zone 23 in the active regions 2A of the semiconductor body 2. Dopants such as e.g. Zn, Mg, Si, Se or Sn can be used for locally deactivating the active zone 23.

Figure 2:
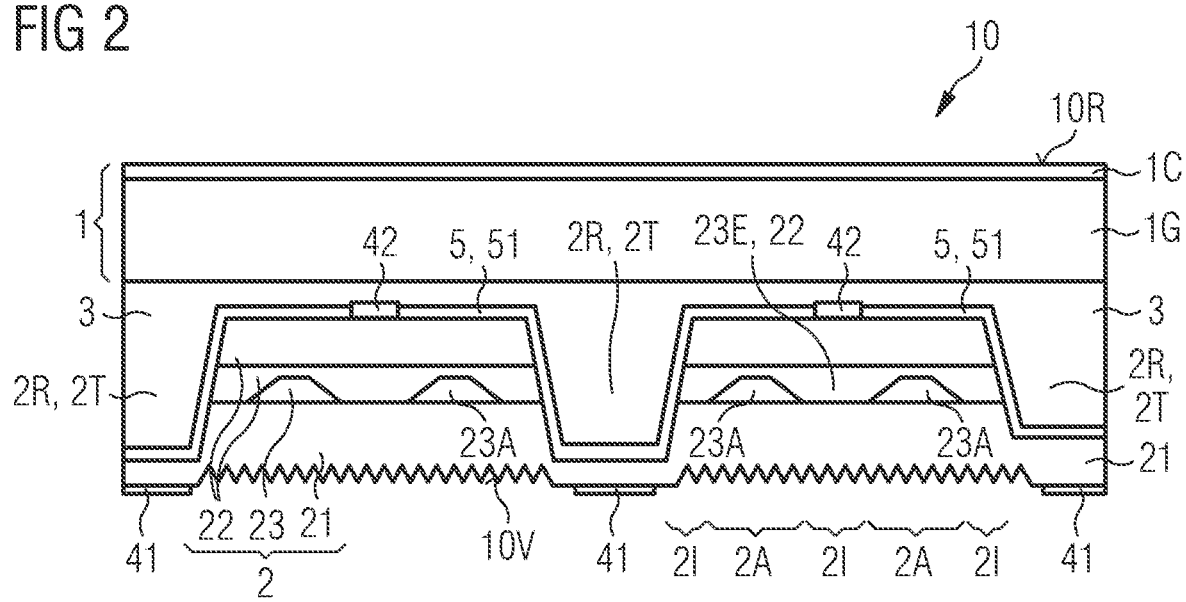

The exemplary embodiment of a component 10 as illustrated in FIG. 2 substantially corresponds to the exemplary embodiment illustrated in FIG. 1. Apart from the design of the active zone 23, the exemplary embodiments described in FIGS. 1 and 2 may be identical. Apart from the features regarding the active zone 23, the features described in association with FIG. 1 can therefore also be used for the exemplary embodiment illustrated in FIG. 2.

Instead of locally deactivated regions in the form of implanted or indiffused regions 23D, the active zone 23 in accordance with FIG. 2 has deactivated regions in the form of ablated and regrown regions 23E, which are not configured for generating electromagnetic radiation during operation of the component 10. The deactivated regions 23E can be filled with a material of the second semiconductor layer 22. The active zone 23 is thus divided into a plurality of active regions 23A and into a plurality of inactive deactivated regions 23E. Consequently, the semiconductor body 2 is likewise divided into a plurality of active regions 2A and into a plurality of inactive regions 2I. For the purpose of producing the inactive regions 23E or 2I, the original active zone 23 can be partly ablated or removed, for example by means of etching, such that only the active, in particular singulated, regions 23A remain on the first semiconductor layer 21. Subsequently, the ablated regions 23E can be regrown with a material of the second semiconductor layer 22. The material of the refilled regions 23E is chosen in regard to the material of the active regions 23A in such a way that a band gap in the active regions 23A is less than a band gap in the ablated and regrown regions 23E.

In accordance with FIG. 2, the active zone 23 is structured in such a way that the active zone 23 has active regions 23A and deactivated regions 23E, wherein the regions 23A and 23E have in particular different materials and different material compositions. In accordance with FIG. 2, the active regions 23A are spaced apart laterally from one another in particular by a material of the second semiconductor layer 22. In contrast to FIG. 2, the active regions 23A in accordance with FIG. 1 in particular directly adjoin the deactivated regions 23D, wherein the active regions 23A and the deactivated regions 23D are based on the same material, in particular are originally based on the same material and for example differ from one another merely with regard to the dopants or doping concentrations.

In accordance with FIG. 2, the active zone 23 can have inner and outer deactivated regions 23E. The outer deactivated regions 23E form in particular a non-radiative edge region of the respective singulated active regions 2A of the semiconductor body 2. The inner deactivated regions 23E can in each case be laterally surrounded, in particular fully circumferentially enclosed, by the active region 23A or by the active regions 23A. In plan view, each partial layer of the second contact structure 42 in particular completely overlaps one of the inner deactivated regions 23E. Such a component 10 is schematically illustrated in plan view in FIG. 5F, for example.

FIGS. 3A, 3B, 3C, 3D, 3E and 3F show various method steps for producing one component 10 or a plurality of components 10 in accordance with FIG. 1. In accordance with FIG. 3A, a semiconductor body 2 is grown on a substrate 9, in particular on a growth substrate 9. For example, the first semiconductor layer 21, the active zone 23 and the second semiconductor layer 22 are applied to the growth substrate 9 epitaxially in the predefined order. By means of indiffusion or implantation of dopants or impurity substances, regions 2I of the semiconductor body 2 or regions 23D of the active zone 23 can be locally deactivated. If a region is locally deactivated, this deactivated or inactive region is no longer provided for generating electromagnetic radiation during operation of the component 10.

FIG. 3B shows the semiconductor body 2 with the inactive regions 2I and active regions 2A in plan view. One of the deactivated regions 23D or of the inactive regions 2I can be embodied in continuous fashion and can extend from one edge to an opposite edge of the semiconductor body 2. If this inactive region 2I is removed regionally, the semiconductor body 2 can have an opening 2R in particular in the form of a network of separating trenches 2T. The opening 2R formed from the interconnected separating trenches 2T is illustrated schematically in FIGS. 3B and 3C. In particular, the opening 2R is formed by partial ablation of the material of the continuous inactive region 2I in such a way that sidewalls of the opening 2R are regionally still covered with the material of the continuous inactive region 2I.

The semiconductor body 2 has a plurality of singulated or isolated active regions 2A, wherein the singulated active regions 2A each have a lateral frame-type edge composed of the residue of the inactive region 2I. The frame-type edge is not configured for generating electromagnetic radiation during operation of the component 10 and has in particular a higher band gap than the regions 23A or 2A. Non-radiative recombinations at the edges of the respective singulated or isolated active region 2A of the semiconductor body can be avoided as a result and in particular on account of the band bending.

As shown in FIGS. 3B and 3C, the semiconductor body 2 has a plurality of singulated localized inactive regions 2I, each of which is assigned in particular to exactly one of the active regions 2A of the semiconductor body 2. Each of these inactive regions 2I has a locally deactivated region 23D of the active zone 23.

FIG. 3D shows the semiconductor body 2 with a plurality of singulated active regions 2A in plan view. In particular, each of the singulated active regions 2A has an outer frame-type inactive region 2I and an inner inactive region 2I. The inner inactive region 2I is completely enclosed by the associated active region 2A in lateral directions, wherein the active region 2A is in turn completely enclosed by the outer inactive region 2I. The semiconductor body 2 can have a plurality of such singulated active regions 2A with an inner and an outer inactive region 2I. The number of singulated active regions 2A can be between 1 and 5000 inclusive, for instance between 1 and 1000 inclusive or between 1 and 100 inclusive, for example between 10 and 5000 inclusive, 100 and 5000 inclusive or between 1000 and 5000 inclusive.

The partial layers of the second contact structure 42 can be formed on the inner inactive regions 2I. In particular, the partial layers do not project laterally beyond the inner inactive regions 2I. Such partial layers of the second contact structure 42 are schematically illustrated in sectional view in FIG. 3E and in plan view in FIG. 3F. The first contact structure 41 is formed in particular on the opening 2R or on the separating trenches 2T. The exemplary embodiment of a component 10 as illustrated in FIGS. 3E and 3F corresponds to the exemplary embodiment of a component 10 as illustrated in FIG. 1 after removal of the growth substrate 9 and structuring of the front side 10V. The component 10 illustrated in FIG. 3F can have a protective layer 2M completely enclosing the semiconductor body 2 in lateral directions. The protective layer 2M is situated in particular in the regions of the mesa trenches that are formed for singulating a plurality of components 10. The method described here is therefore likewise suitable for producing a plurality of components 10.

Figure 4A:
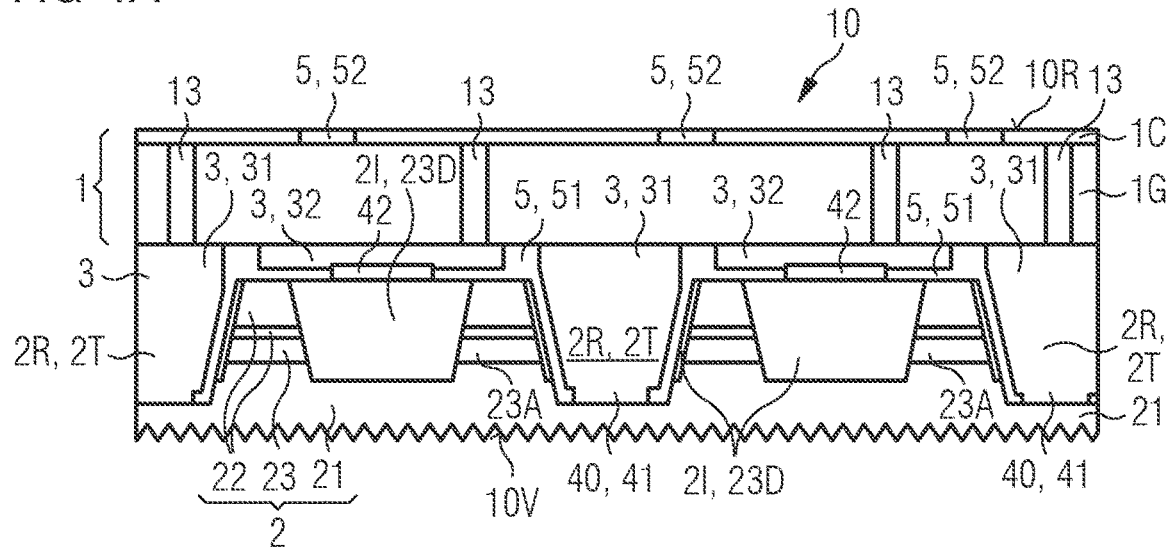
FIGS. 4A and 4B show schematic illustrations of further exemplary embodiments of a component in sectional views.

The exemplary embodiment of a component 10 as illustrated in FIG. 4A substantially corresponds to the exemplary embodiment illustrated in FIG. 1. In contrast thereto, the intermediate layer 3 has a first partial layer 31 and a second partial layer 32, wherein the partial layers 31 and 32 are assigned to different electrical polarities of the component 10. The first insulation structure 51 extends regionally through the intermediate layer 3 and thus insulates the first partial layer 31 from the second partial layer 32.

The second partial layer 32 is in particular configured for electrically contacting the second semiconductor layer 22 and is electrically conductively connected to the second contact structure 42. In particular, the second partial layer 32 has no overlaps with the opening 2R or with the separating trenches 2T of the opening 2R in plan view. The first partial layer 31 extends in particular into the opening 2R and through the first insulation structure 51 to the first semiconductor layer 21. The first partial layer 31 thus forms the first contact structure 41 in particular in the form of a via contact 40. The intermediate layer 3 can have a plurality of such first partial layers 31 and/or a plurality of such second partial layers 32.

In accordance with FIG. 4A, the first partial layers 31 and the second partial layers 32 are arranged next to one another along the lateral directions. In plan view, the partial layers 31 and 32 are free of overlap, in particular. The front side 10V of the component 10 is free of any electrical contact structures, in particular. A shading of the front side 10V by electrical contact structures can thus be avoided.

As illustrated schematically in FIG. 4A, the partial layers 31 and 32 can be electrically conductively connected to different partial regions of the cover layer 1C by way of different through contacts 13 through the main body 1G. The partial regions of the cover layer 1C can be electrically insulated from one another by the second insulation structure 52.

Figure 4B:
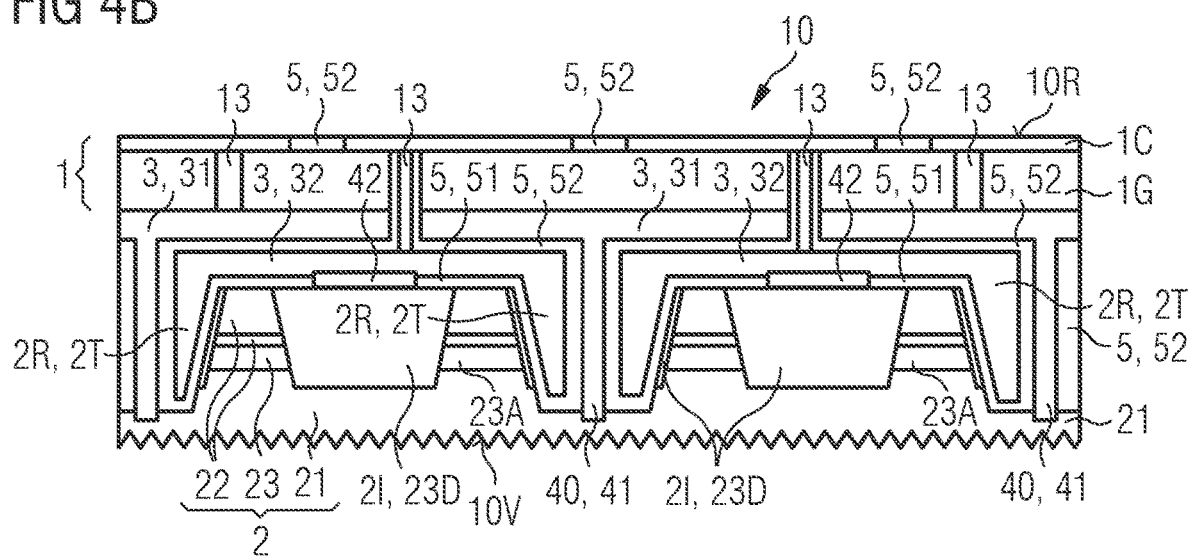

The exemplary embodiment of a component 10 as illustrated in FIG. 4B substantially corresponds to the exemplary embodiment illustrated in FIG. 4A. In contrast thereto, the first partial layer 31 and the second partial layer 32 of the intermediate layer 3 are arranged one above the other in the vertical direction. For the purpose of electrically contacting with partial regions of the cover layer 1C, some through contacts 13 can extend from the second partial layer 32 through the first partial layer 31.

The component 10 has a second insulation structure 52, which is configured for electrically insulating the first partial layer 31 from the second partial layer 32 and is arranged between the partial layers 31 and 32 in the vertical direction. For the purpose of electrically contacting the first semiconductor layer 21, the component 10 has the first contact structure 41 in the form of one via contact 40 or in the form of a plurality of via contacts 40. The via contacts 40 and the first partial layer 31 of the intermediate layer 3 can be formed from the same material or from different materials. In accordance with FIG. 4B, the opening 2R is filled, in particular completely filled, by the via contacts 40, the insulation structures 51 and 52 and also by the second partial layer 32 of the intermediate layer 3.

Figure 5A:
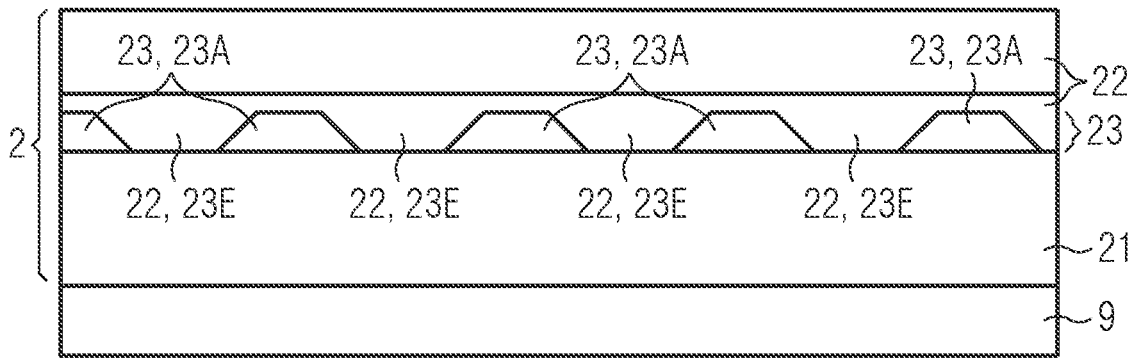
Figure 5B:
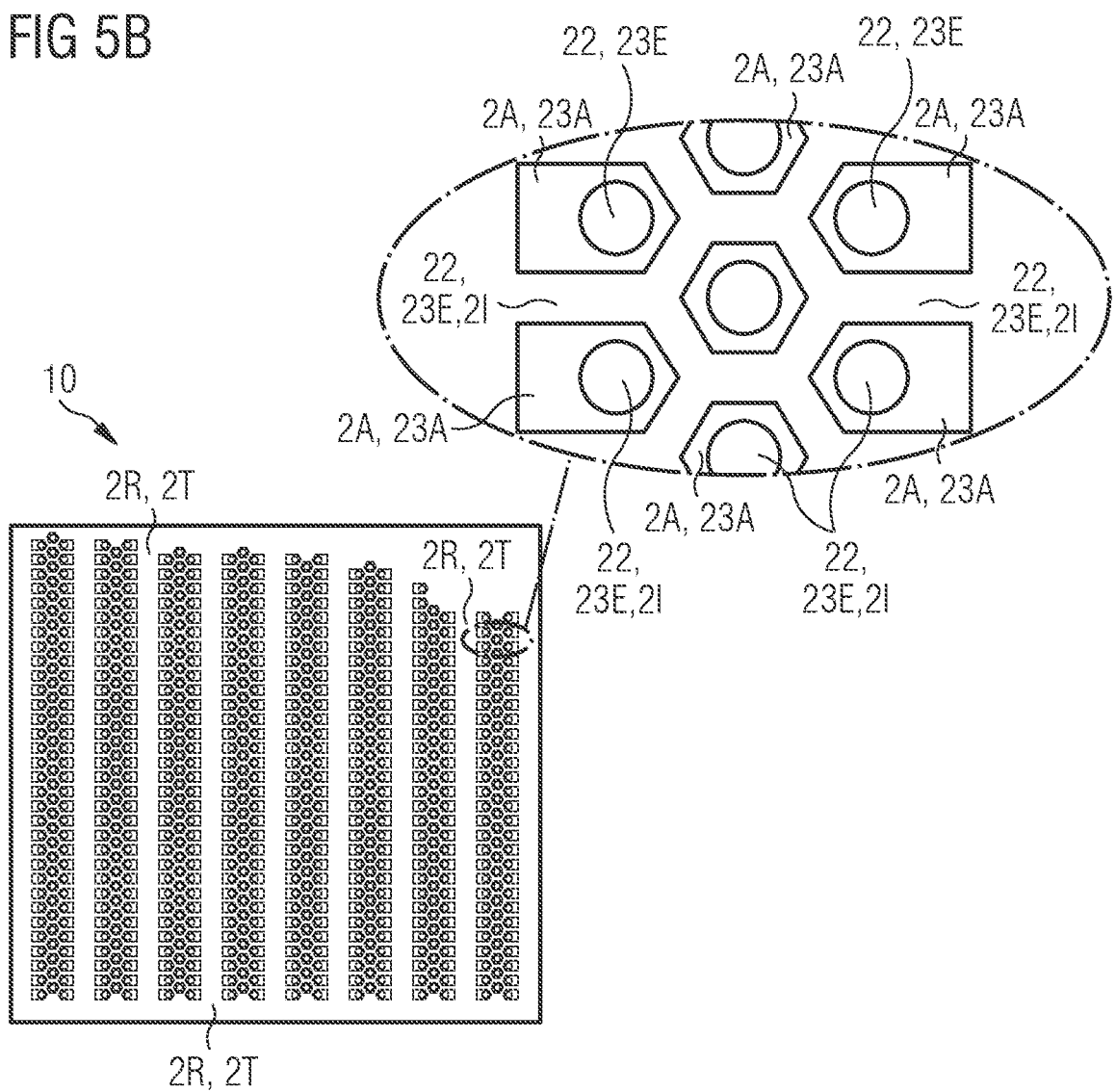

FIGS. 5A, 5B, 5C, 5D, 5E and 5F show various method steps for producing one component 10 or a plurality of components 10 in accordance with FIG. 2. The method steps illustrated in FIGS. 5A, 5B, 5C, 5D, 5E and 5F substantially correspond to the method steps for producing one or more components 10 as illustrated in FIGS. 3A, 3B, 3C, 3D, 3E and 3F. In contrast thereto, inactive regions 2I are not produced by local deactivation of the active zone 23 or of the semiconductor body 2, but rather by local ablation or removal of the active zone 23 in order to form the deactivated regions 23E, wherein the deactivated regions 23E of the active zone 23 are regrown in particular by a material of the second semiconductor layer 22. The exemplary embodiment of a component 10 as illustrated in FIGS. 5E and 5F corresponds to the exemplary embodiment of a component 10 as illustrated in FIG. 2.

Figure 5C:
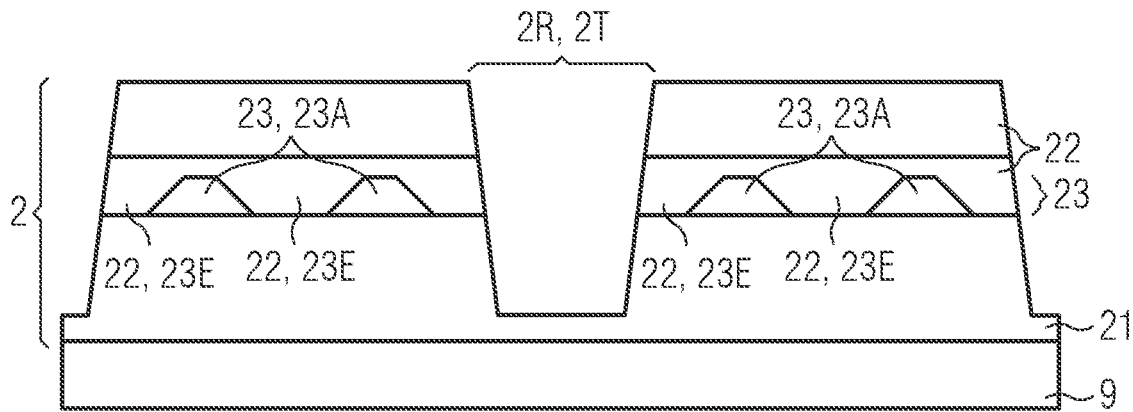
Figure 5D:
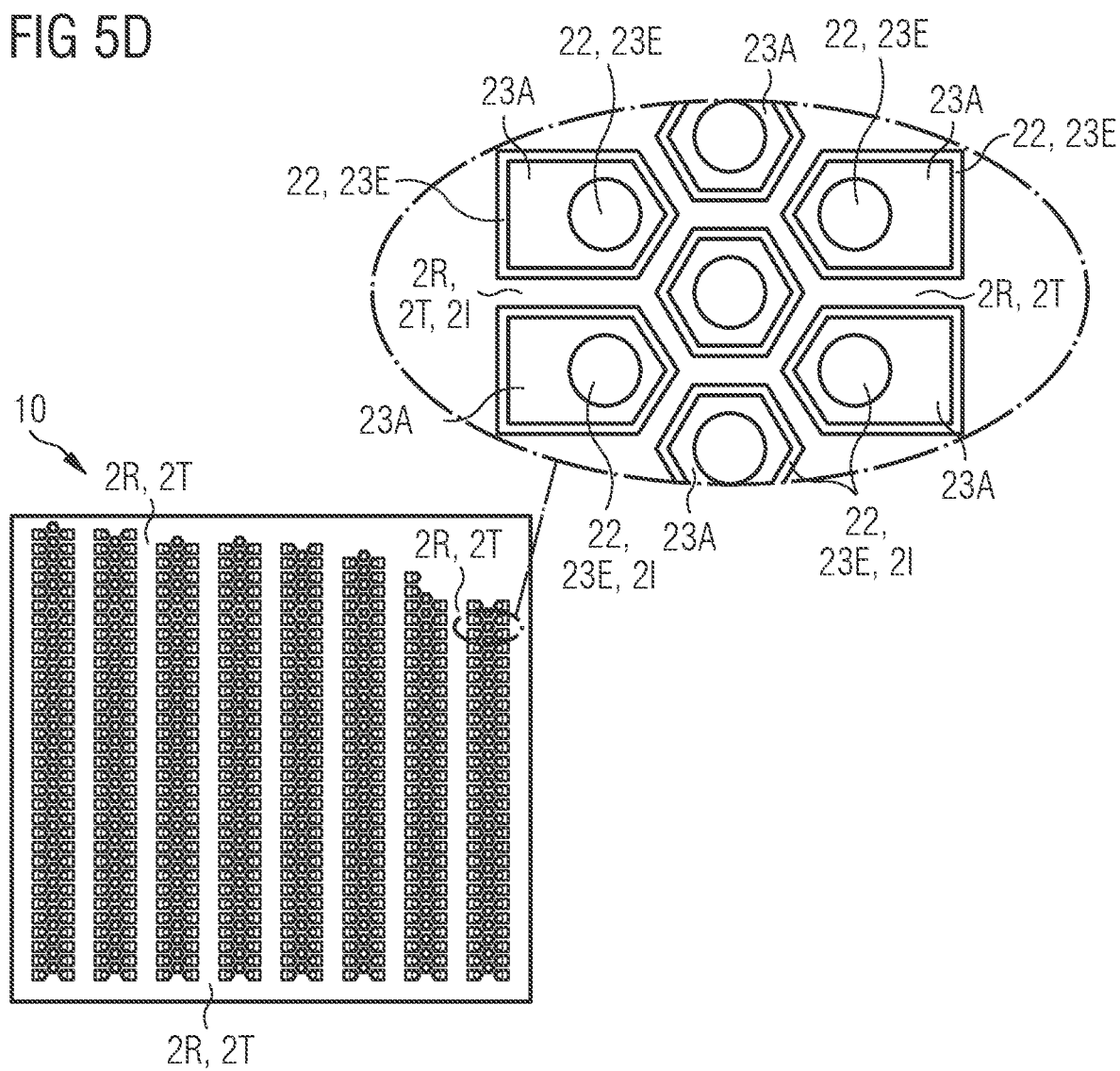
Figure 6A:
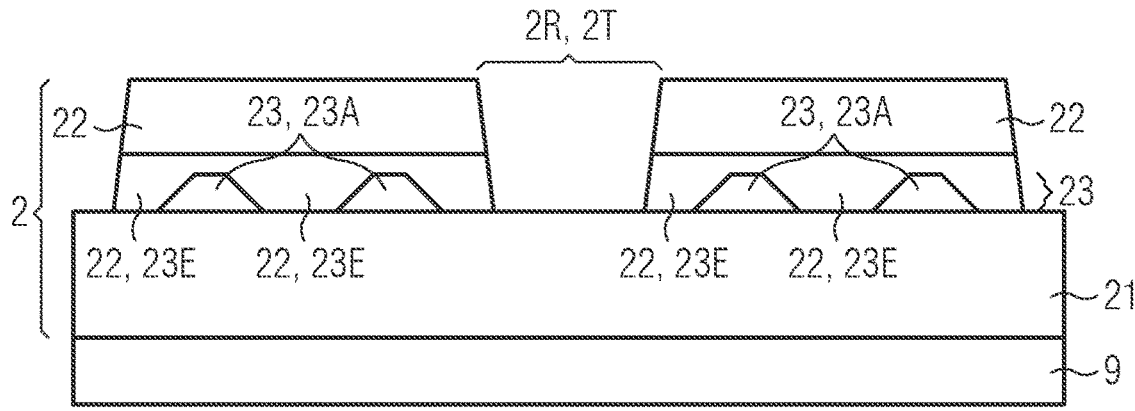
FIGS. 6A and 6B show schematic illustrations of further steps of a method for producing a component in sectional views.

The exemplary embodiment of a method step as illustrated in FIG. 6A substantially corresponds to the exemplary embodiment illustrated in FIG. 5C. In contrast thereto, the opening 2R can be set in such a way that, unlike in FIG. 5C, said opening does not extend into the first semiconductor layer 21, but rather ends on the first semiconductor layer 21. A component 10 produced according to the method step in accordance with FIG. 6A is illustrated schematically in sectional view in FIG. 6B, for example.

Figure 6B:
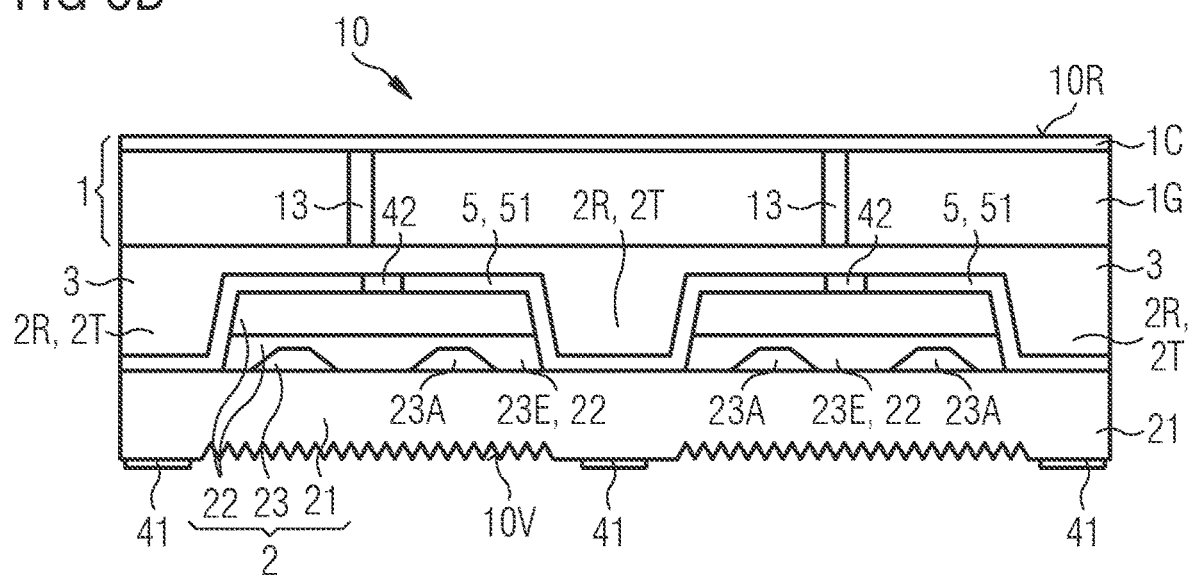

The exemplary embodiment of a component 10 as illustrated in FIG. 6B substantially corresponds to the exemplary embodiment illustrated in FIG. 2. In contrast thereto, the opening 2R does not extend into the first semiconductor layer 21, but rather ends on the latter. Moreover, the carrier 1 has a plurality of through contacts 13 extending through the main body 1G and connecting the intermediate layer 3 to the cover layer 1C in an electrically conductive manner. It is possible for all of the exemplary embodiments described here to have such through contacts 13.

Figure 7A:
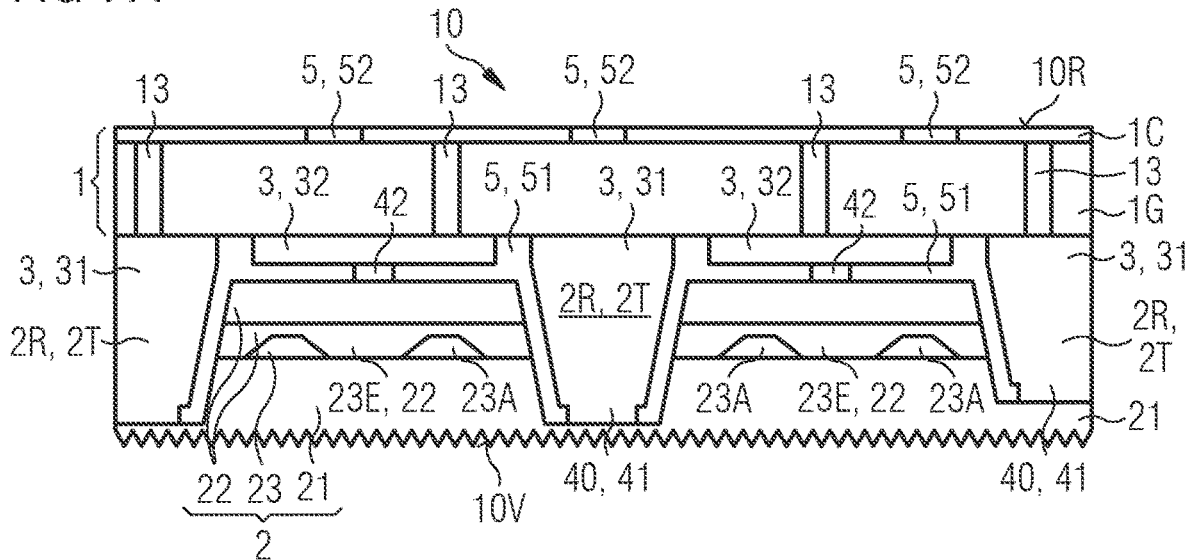
FIGS. 7A and 7B show schematic illustrations of further exemplary embodiments of a component in sectional views.
Figure 7B:
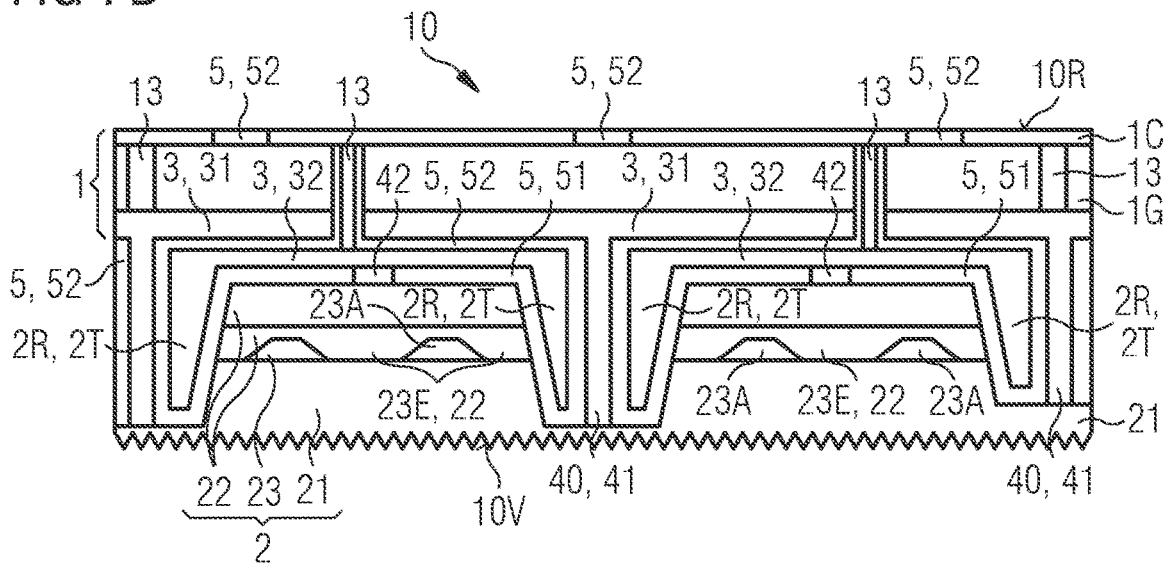

The exemplary embodiments of a component 10 as illustrated in FIGS. 7A and 7B substantially correspond to the exemplary embodiment illustrated in FIG. 2. In contrast thereto, the intermediate layer 3 has a first partial layer 31 and a second partial layer 32 or a plurality of first and second partial layers 31 and 32, wherein the partial layers 31 and 32 described in FIGS. 7A and 7B are embodied analogously to the partial layers 31 and 32 illustrated in FIGS. 4A and 4B. The features of the partial layers 31 and 32 described in association with FIGS. 4A and 4B can therefore be used for the exemplary embodiments illustrated in FIGS. 7A and 7B.

By means of partial deactivation of the active zone for the formation of the local deactivated regions and also for the passivation of the edges of the remaining active regions of the active zone, non-radiative recombinations of charge carriers can be reduced or prevented. The deactivation can be effected by implantation, diffusion or by ablation and regrowth. As a result of the deactivation, it is possible to attain a higher band gap in the deactivated regions and/or band bending in the edge regions. In order to avoid the shading effects as a result of the contact structures, it is possible to form deep microprisms in the semiconductor body, wherein the contact structures can be formed in regions of the microprisms. The formation of the deep microprisms also results in reduced radiation absorption by the semiconductor body.

By means of the formation of the deactivated regions 23D and/or 23E of the active zone 23 and the targeted arrangement of the contact structures 41 and 42 in particular in the regions of overlap with the inactive regions 2I of the semiconductor body 2 and/or in the opening 2R, it is possible to significantly reduce radiation losses on account of absorption at the contact structures 41 and 42 or in the semiconductor body 2. The formation of separating trenches 2T, in particular in the form of deep microprisms, also makes it possible for properties regarding waveguiding in the component 10, in particular in the semiconductor body 2, to be set in a targeted manner, whereby internal radiation losses can be minimized.

The invention is not restricted to the exemplary embodiments by the description of the invention on the basis of said exemplary embodiments. Rather, the invention encompasses any novel feature and also any combination of features, which in particular includes any combination of features in the claims, even if this feature or if this combination itself is not explicitly specified in the claims or exemplary embodiments.

The invention claimed is:

1. A component comprising a carrier, a semiconductor body arranged on the carrier, an intermediate layer arranged at least regionally between the carrier and the semiconductor body, and a first contact structure, wherein
   the semiconductor body has a first semiconductor layer, a second semiconductor layer and an active zone, which is arranged in a vertical direction between the semiconductor layers and is configured for generating electromagnetic radiation,
   the active zone has locally deactivated regions along lateral directions, which are not configured for generating electromagnetic radiation,
   the semiconductor body has an opening extending through the second semiconductor layer and the active zone toward the first semiconductor layer, wherein the opening is different than the locally deactivated regions of the active zone and is partly filled with a material of the intermediate layer, the first contact structure is configured for electrically contacting the first semiconductor layer and overlaps the opening in plan view, and the active zone is subdivided into a plurality of singulated active regions, wherein each singulated active region is assigned an inner deactivated region and the inner deactivated region is partly or fully circumferentially laterally enclosed by the associated singulated active region, wherein the component has at least one of the following additional features, according to which:
 i. the locally deactivated regions are furthermore embodied as electrically conductive and have a higher band gap than active regions of the active zone; or
 ii. the opening has a network of interconnected separating trenches, such that the opening is embodied regionally in trench-type fashion and in continuous fashion, and the singulated active regions are in each case enclosed in lateral directions by the locally deactivated regions.

2. The component as claimed in claim 1, wherein the locally deactivated regions are the ablated and regrown regions of the active zone.

3. The component as claimed in claim 1, wherein the locally deactivated regions are the regions of the active zone which are implanted or indiffused with impurity atoms or with impurity ions.

4. The component as claimed in claim 1, wherein the active zone has active regions configured for generating electromagnetic radiation, wherein the first contact structure is free of an overlap with the active regions of the active zone in plan view.

5. The component as claimed in claim 1, according to which
 the opening has a network of interconnected separating trenches, such that the opening is embodied regionally in trench-type fashion and in continuous fashion, and
 the singulated active regions are in each case enclosed in lateral directions by the locally deactivated regions.

6. The component as claimed in claim 1 that
 the locally deactivated regions are furthermore embodied as electrically conductive and have a higher band gap than active regions of the active zone.

7. The component as claimed in claim 1,
 which has a second contact structure for electrically contacting the second semiconductor layer, wherein the second contact structure is arranged in a vertical direction between the carrier and the semiconductor body and overlaps the inner deactivated region of the active zone in plan view.

8. The component as claimed in claim 1,
 wherein each singulated active region is assigned an outer deactivated region of the active zone, wherein the outer deactivated region laterally encloses the associated singulated active region.

9. The component as claimed in claim 1,
 wherein the first contact structure is embodied in the form of a via contact arranged within the opening, wherein, for the purpose of electrically contacting the first semiconductor layer, the via contact extends through the second semiconductor layer and the active zone.

10. The component as claimed in claim 1,
 wherein the first contact structure is arranged on a surface of the semiconductor body facing away from the carrier and directly adjoins the first semiconductor layer.

11. The component as claimed in claim 1,
 wherein the intermediate layer is a continuous, electrically conductive layer, wherein the intermediate layer is configured exclusively for electrically contacting the second semiconductor layer of the semiconductor body.

12. The component as claimed in claim 1,
 wherein the intermediate layer has a first partial layer for electrically contacting the first semiconductor layer and a second partial layer for electrically contacting the second semiconductor layer, wherein the first partial layer and the second partial layer are laterally spaced apart and free of overlap in plan view.

13. The component as claimed in claim 1,
 wherein the intermediate layer has a first partial layer for electrically contacting the first semiconductor layer and a second partial layer for electrically contacting the second semiconductor layer, wherein the first partial layer and the second partial layer are arranged one above the other in a vertical direction and are electrically insulated from one another by insulation structures.

14. The component as claimed in claim 1,
 wherein the active zone has locally deactivated regions and active regions along lateral directions, wherein
 the locally deactivated regions and the active regions are based on the same semiconductor material, and
 the locally deactivated regions have implanted or indiffused impurity atoms or impurity ions in comparison with the active regions, as a result of which the locally deactivated regions have a higher band gap than the active regions.

15. The component as claimed in claim 1,
 wherein the active zone has the locally deactivated regions and active regions along lateral directions, wherein
 the locally deactivated regions are locally ablated and regrown regions,
 the locally deactivated regions and the active regions differ from one another with regard to the material composition, and
 the locally deactivated regions and the second semiconductor layer are based on the same semiconductor material.

16. The component as claimed in claim 1, which has both additional feature i and additional feature ii.

17. A method for producing a component comprising a carrier, a semiconductor body arranged on the carrier, an intermediate layer arranged at least regionally between the carrier and the semiconductor body, and a first contact structure, wherein
 the semiconductor body has a first semiconductor layer, a second semiconductor layer and an active zone, which is arranged in a vertical direction between the semiconductor layers and is configured for generating electromagnetic radiation,
 the semiconductor body has an opening extending through the second semiconductor layer and the active zone toward the first semiconductor layer and being partly filled with a material of the intermediate layer,
 the first contact structure is configured for electrically contacting the first semiconductor layer and overlaps the opening in plan view, the active zone is deactivated regionally along lateral directions, such that the active zone has locally deactivated regions, which are not configured for generating electromagnetic radiation, and the opening is different than the locally deactivated regions of the active zone, the active zone is subdivided into a plurality of singulated active regions, wherein each singulated active region is assigned an inner deactivated region and the inner deactivated region is partly or fully circumferentially laterally enclosed by the associated singulated active region, wherein the component to be produced has at least one of the following additional features, according to which:

i. the locally deactivated regions are furthermore embodied as electrically conductive and have a higher band gap than active regions of the active zone; or ii. the opening has a network of interconnected separating trenches, such that the opening is embodied regionally in trench-type fashion and in continuous fashion, and the singulated active regions are in each case enclosed in lateral directions by the locally deactivated regions.

18. The method as claimed in claim 17, wherein, for the purpose of producing the locally deactivated regions, the active zone is deactivated regionally along lateral directions by means of ion implantation.

19. The method as claimed in claim 17, wherein, for the purpose of producing the locally deactivated regions, the active zone is deactivated regionally along lateral directions by means of diffusion of impurity atoms or impurity ions.

20. The method as claimed in claim 17, wherein, for the purpose of producing the locally deactivated regions, the active zone is locally ablated and the locally ablated regions are subsequently regrown with a material of the second semiconductor layer.

* * * * *